(12) United States Patent
Kim

(10) Patent No.: US 6,728,106 B2
(45) Date of Patent: Apr. 27, 2004

(54) HEAT DISSIPATION STRUCTURE OF INTEGRATED CIRCUIT (IC)

(75) Inventor: Jong Sik Kim, Gumi-si (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 10/095,467

(22) Filed: Mar. 13, 2002

(65) Prior Publication Data

US 2002/0131240 A1 Sep. 19, 2002

(30) Foreign Application Priority Data

Mar. 16, 2001 (KR) .................... 10-2001-13774

(51) Int. Cl.[7] ................................. H05K 7/20
(52) U.S. Cl. ............... 361/719; 174/252; 228/179.1
(58) Field of Search ................ 165/80.3, 185; 174/16.3, 252; 228/179.1, 180.1, 248.1; 257/706, 713, 720; 361/703–705, 707–712, 717–719

(56) References Cited

U.S. PATENT DOCUMENTS

| | | | | |
|---|---|---|---|---|
| 3,777,220 A | * | 12/1973 | Tatusko et al. | 361/777 |
| 4,396,936 A | * | 8/1983 | McIver et al. | 174/252 |
| 5,699,610 A | * | 12/1997 | Shimada et al. | 29/840 |
| 5,708,566 A | * | 1/1998 | Hunninghaus et al. | 361/704 |
| 6,175,497 B1 | * | 1/2001 | Tseng et al. | 361/704 |
| 6,268,654 B1 | * | 7/2001 | Glenn et al. | 257/704 |

* cited by examiner

Primary Examiner—G. Tolin
(74) Attorney, Agent, or Firm—Fleshner & Kim, LLP

(57) ABSTRACT

A heat dissipation structure of an IC includes a circuit board provided with through holes perforated thereinto, an IC mounted on the upper surface of the circuit board, a solder filling a space between the circuit board and the IC via the through holes and being cured, and solder lands formed on the circuit board and attached with the solder.

16 Claims, 4 Drawing Sheets

HEAT DISSIPATION STRUCTURE OF INTEGRATED CIRCUIT (IC)

BACKGROUND OF THE INVENTION

1. Field of the Invention

The present invention relates to an integrated circuit (IC) for electronic appliances such as TVs, and more particularly to a heat dissipation structure of an IC, which utilizes solder as a substitute for a conventional heat sink so as to dissipate the heat generated from the IC mounted on a circuit board, thereby eliminating the heat sink installation and simplifying the assembly process.

2. Description of the Related Art

As well known to those skilled in the art, a plurality of small package ICs with different functions and purposes are mounted on a circuit board, which is used in electric appliances such as TVs. The heat is generated by the current flow of the circuit board and the ICs during the operation of the ICs.

The generated heat must be appropriately dissipated in a timely manner to ensure proper operation of the device. The insufficient dissipation of the heat generated from the ICs may lead to a build-up of heat and further cause a malfunction or fatal defects to the package assembly products. Therefore, a heat sink for dissipating the generated heat is installed on the ICs.

FIG. 1 is an exploded perspective view of a heat dissipation structure of a conventional IC.

With reference to FIG. 1, the conventional IC heat dissipation structure includes a circuit board 1, a small-sized package IC 2 mounted on the upper surface of the circuit board 1, a heat sink 3 attached to the upper active surface of the IC 2, and a double-sided adhesive tape 4 for attaching the heat sink 3 to the upper active surface of the IC 2.

The heat sink 3 employs an air natural cooling method. Therefore, as shown in FIG. 1, in order to maximize the heat dissipation surface and to more effectively cool the IC 2, the heat sink 3 has a folded structure or a plurality of grooves.

Moreover, in order to promptly and effectively dissipate the heat generated by the IC 2, the heat sink 3 is desirably integrated with the IC 2. However, since many circuits are formed on the upper active surface of the IC 2, the double-sided adhesive tape 4 is used to protect the circuits of the upper active surface of the IC 2 and to dissipate the heat generated from the IC 2.

FIG. 2 is a cross-sectional view of the heat dissipation structure of the conventional IC.

With reference to FIG. 2, the heat generated from the IC 2 is transmitted to the heat sink 3 via the double-sided adhesive tape 4.

The heat transmitted to the heat sink 3 is dissipated to the air through an interface between the heat sink 3 and the air.

In the aforementioned heat dissipation structure of the conventional IC 2, the heat is dissipated through the heat sink 3.

However, such a conventional heat dissipation structure is limited in its application to micro package ICs. Further, the heat sink 3 of the conventional heat dissipation structure is attached to the upper active surface of the IC 2, thereby deteriorating the efficiency of the use of space.

Further, the conventional heat dissipation structure requires an additional cost for manufacturing such a heat sink.

Moreover, the conventional heat dissipation structure requires a step for attaching the heat sink to the IC, thus increasing the production cost and reducing the economic efficiency.

SUMMARY OF THE INVENTION

Therefore, the present invention has been made in view of the above problems, and it is an object of the present invention to provide a heat dissipation structure, which utilizes solder as a substitute for a conventional heat sink so as to dissipate the heat generated from the IC mounted on a circuit board, thereby eliminating the heat sink installation step and simplifying the assembly process.

In accordance with the present invention, the above and other objects can be accomplished by the provision of a heat dissipation structure of an IC comprising a circuit board provided with through holes perforated thereinto, an IC mounted on the upper surface of the circuit board, a solder filling a space between the circuit board and the IC via the through holes and being cured, and solder lands formed on the circuit board and attached with the solder.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
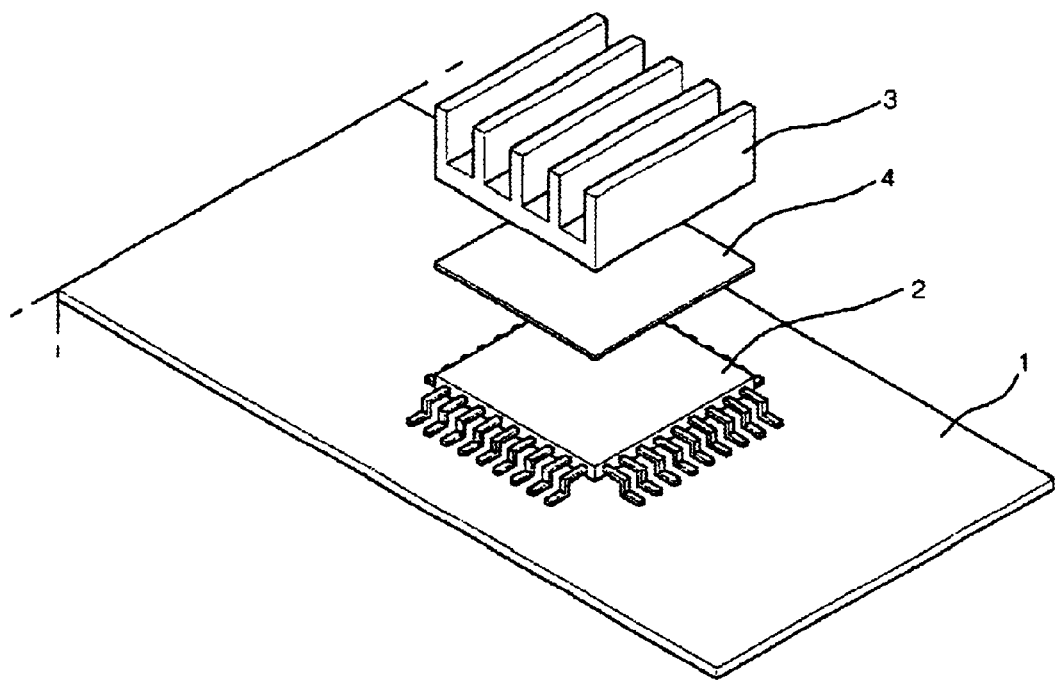
FIG. 1 is an exploded perspective view of a heat dissipation structure of a conventional IC.
Figure 2:
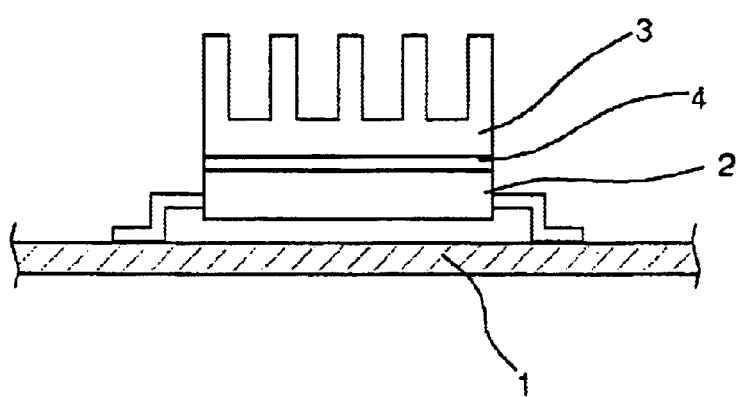
FIG. 2 is a cross-sectional view of the heat dissipation structure of the conventional IC.
Figure 3:
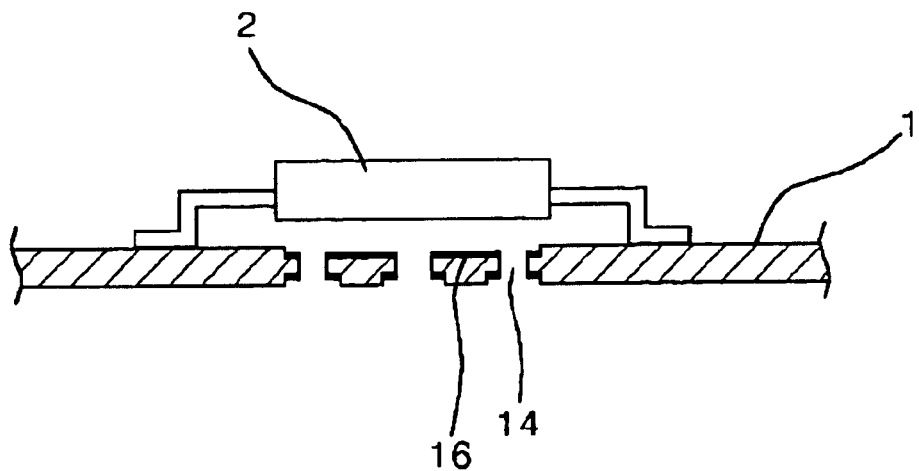
FIG. 3 is a cross-sectional view of a heat dissipation structure of an IC in accordance with one embodiment of the present invention.

FIG. 3 is a cross-sectional view of a heat dissipation structure of an IC in accordance with one embodiment of the present invention.

With reference to FIG. 3, the heat dissipation structure of this embodiment of the present invention includes a circuit board 1 provided with a plurality of through holes 14 perforated thereinto, solder lands 16 formed on the circuit board 1 by coating and patterning a thin copper film, a small-sized package IC 2 mounted on the upper surface of the circuit board 1 and opposed to the solder lands 16, and solder 17 filling a space between the circuit board 1 and the IC 2 via the through holes 14 and cured.

The number of the through holes 14 is determined by the area of the solder lands 16 and the size of the IC 2.

As described above, the solder lands 16 are thin copper patterns on the circuit board 1. The solder 17 is attached to the solder lands 16.

The solder lands 16 may be formed on the upper surfaces of the through holes 14 as well as the upper surface of the circuit board 1.

Further, the solder lands 16 may be formed on the inner walls of the through holes 14, thereby effectively being filled with the solder 17.

Preferably, in accordance with many experimental test results, the through hole 14 has a diameter of approximately 0.5 mm to 1.0 mm in order to be more effectively filled with the solder 17.

The solder 17 may use a designated compound material made of lead(Pb), tin(Sn), zinc(Zn), etc.

An operation of this embodiment of the present invention is described hereinafter.

After mounting the IC 2 on the upper surface of the circuit board 1 provided with the solder lands 16, the solder 17 is entered via the through holes 14 of the circuit board 1.

The filling method of the solder 17 is described hereinafter.

The lower surface of the circuit board 1 with the IC chip 2 mounted on its upper surface is brought into contact with the upper surface of a solder tank filled with the solder 17.

Then, the solder 17 is entered via the through holes 14 of the circuit board 1 by the surface tension.

The entered solder 17 fills in the space between the circuit board 1 and the IC 2. The filling solder is cured and integrated with the solder lands 16 and the lower surface of the IC 2.

Further, the solder is attached to the solder lands 16 coated on the lower surface of the through holes 14 by the surface tension.

Figure 4:
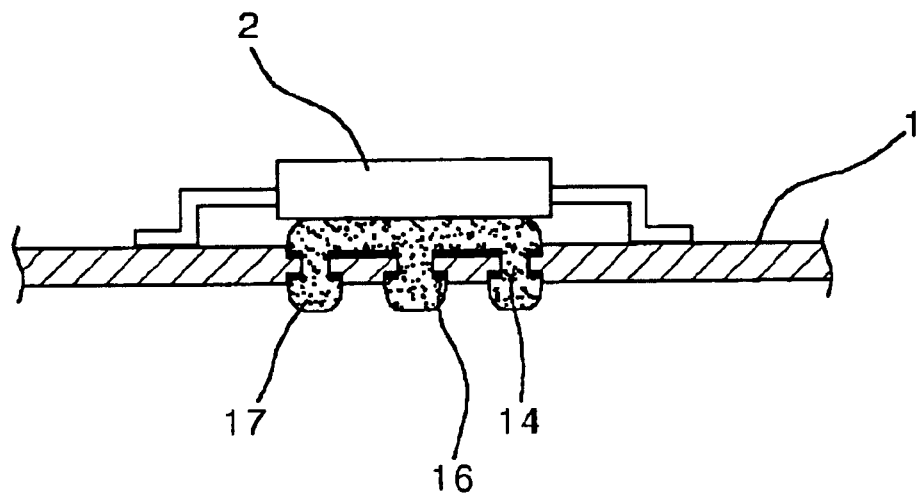
FIG. 4 is a cross-sectional view of the heat dissipation structure of the IC of FIG. 3 in a solder filling condition.

FIG. 4 is a cross-sectional view of the heat dissipation structure of the IC of FIG. 3 in a solder filling condition.

With reference to FIG. 4, a process for dissipating the heat with the heat dissipation structure according to this embodiment of the present invention is described hereinafter.

The heat generated from the IC 2 is transmitted to a first portion of the solder 17 made of metal, which is located under the IC 2.

The transmitted heat is then transmitted to a second portion of the solder 17, which is located within the through holes 14, and to a third portion of the solder 17, which is attached to the solder lands 14 on the through holes 14 of the lower surface of the circuit board 1.

The third portion of the solder 17, which is attached to the solder lands 14 on the through holes 14 of the lower surface of the circuit board 1, serves as a heat sink. That is, the heat generated from the IC 2 is dissipated to the air via an interface between the third portion of the solder 17 and the air.

Figure 5:
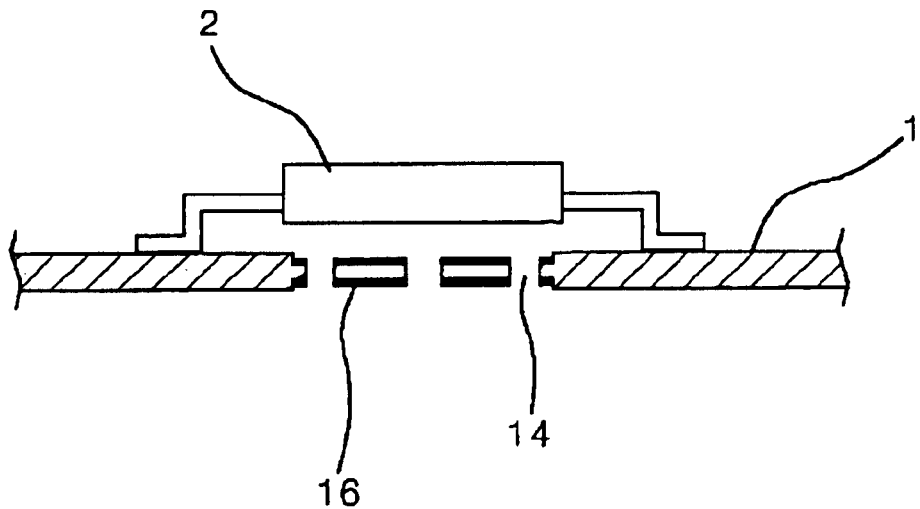
FIG. 5 is a cross-sectional view of a heat dissipation structure of an IC in accordance with another embodiment of the present invention.

FIG. 5 is a cross-sectional view of a heat dissipation structure of an IC in accordance with another embodiment of the present invention.

Differing from the preceding embodiment in FIG. 3, in this embodiment in FIG. 5, the solder lands 16 are formed not only on the upper surface of the circuit board 1 and the adjacent area to the through holes 14 but also on the lower surface of the circuit board 1.

Since the solder lands 16 are formed on the lower surface of the circuit board 1, a solder attached area, i.e., a dissipating surface is expanded, thereby increasing a heat dissipating efficiency.

Figure 6:
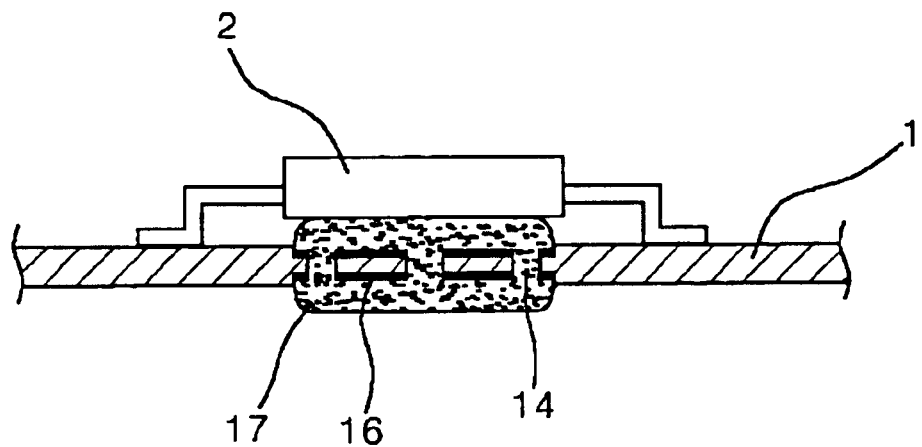
FIG. 6 is a cross-sectional view of the heat dissipation structure of the IC of FIG. 5 in a solder filling condition.

FIG. 6 is a cross-sectional view of the heat dissipation structure of the IC of FIG. 5 in a solder filling condition.

As described above, since the solder lands 16 are formed not only on the upper surface of the circuit board 1 and the adjacent area to the through holes 14 but also on the lower surface of the circuit board 1, the solder 17 is formed over the larger area of the lower surface of the circuit board 1 as compared with the preceding embodiment of FIG. 4.

Therefore, as a solder attached area is expanded, the heat dissipating effect increases.

Figure 7:
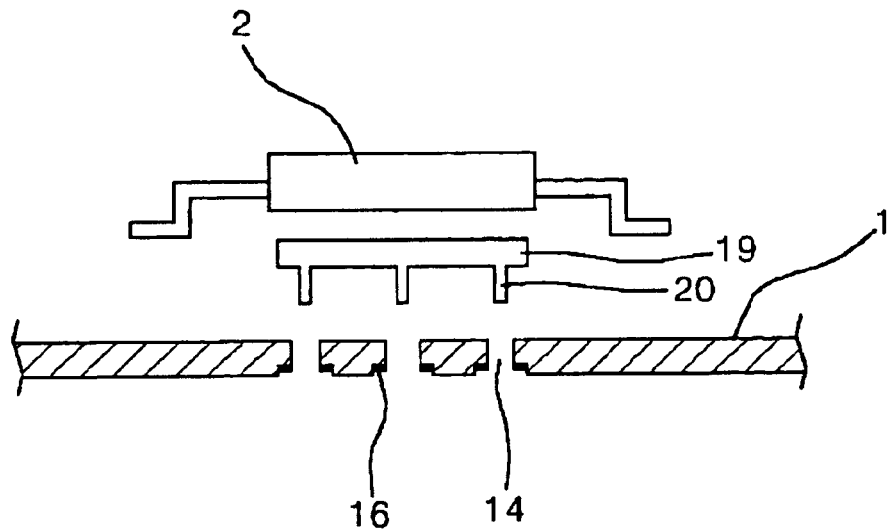
FIG. 7 is an exploded cross-sectional view of a heat dissipation structure of an IC in accordance with yet another embodiment of the present invention.

FIG. 7 is an exploded cross-sectional view of a heat dissipation structure of an IC in accordance with yet another embodiment of the present invention.

The heat dissipation structure of this embodiment of the present invention includes the circuit board 1, the through holes 14 perforated in the circuit board 1, solder lands 16 formed on the circuit board 1 by coating and patterning a thin copper film, a small-sized package IC 2 mounted on the upper surface of the circuit board 1 and opposed to the solder lands 16, a thermal conductor installed on the lower surface of the IC 2 via the through holes 14, and solder 17 attached to the solder lands 16.

Preferably, the thermal conductor 19 is made of aluminum (Al) with a high thermal conductivity.

The thermal conductor 19 includes a plurality of lugs 20 extruded from its lower surface. The lugs 20 are inserted into the through holes 14 of the circuit board 1.

The upper surface of the thermal conductor 19 may be attached to the lower surface of the IC 2 by the double-sided adhesive tape 4.

The thermal conductor 19 may be formed in various shapes, particularly in a regular square removing the lugs 20.

The solder lands 16 may be formed on an interface between the thermal conductor 16 and the circuit board 1, i.e., the upper surface of the circuit board 1, thereby more firmly attaching the thermal conductor 16 to the circuit board 1.

Figure 8:
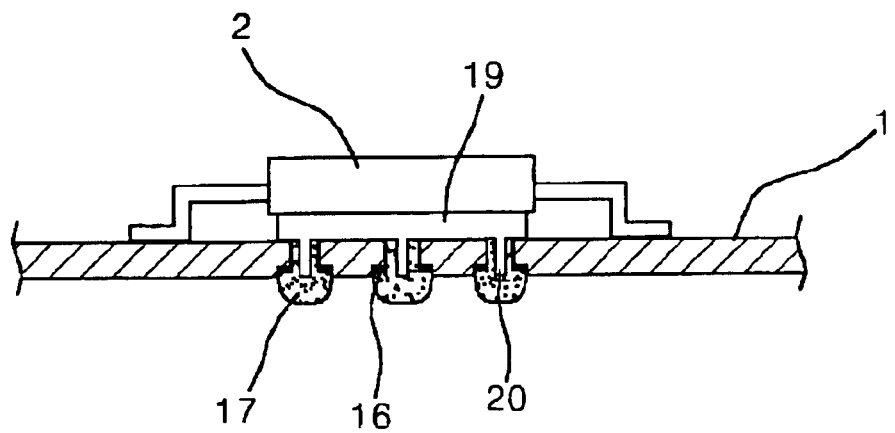
FIG. 8 is a cross-sectional view of the heat dissipation structure of the IC of FIG. 7 in a solder filling condition.

FIG. 8 is a cross-sectional view of the heat dissipation structure of the IC of FIG. 7 in a solder filling condition.

The thermal conductor 19 is installed between the IC 2 and the circuit board 1.

The lower surface of the circuit board 1 is brought into contact with the upper surface of the solder tank filled with the solder 17. Then, the solder 17 fills the through holes 14 and is attached to the solder lands 16 of the through holes 14 on the lower surface of the circuit board 1 by the surface tension, and cured.

With reference to FIG. 8, a process for dissipating heat with the heat dissipation structure according to this embodiment of the present invention is described hereinafter.

The heat generated from the IC 2 is transmitted to the thermal conductor 19 attached to the lower surface of the IC 2.

The transmitted heat is then transmitted to a portion of the solder 17, which is located within the through holes 14 under the thermal conductor 19, and to another portion of the solder 17, which is attached to the solder lands 16 on the through holes 14 of the lower surface of the circuit board 1.

The portion of the solder 17, which is attached to the solder lands 16 on the through holes 14 of the lower surface of the circuit board 1, serves as a heat sink. That is, the heat generated from the IC 2 is dissipated to the air via an interface between such a portion of the solder 17 and the air.

As apparent from the above description, the present invention provides a heat dissipation structure, which may be used in the small-sized package IC 2 as a substitute for a conventional heat sink in order to dissipate the heat generated from the IC 2. Alternatively, the heat dissipation structure of the present invention may be additionally employed in a small-sized package IC pre-provided with the heat sink on its upper surface.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A heat dissipation structure of an IC comprising:
   a circuit board provided with through holes perforated thereinto;
   a thermal conductor mounted on the upper surface of the circuit board;
   an IC mounted on the upper surface of said thermal conductor and connected to said circuit board;
   a solder filling said through holes and attached to an area adjacent to the through holes, then being cured; and
   solder lands formed on said circuit board and attached with said solder.

2. The heat dissipation structure of the IC as set forth in claim 1, further comprising a double-sided adhesive tape formed on an interface between said thermal conductor and said IC so as to attach said thermal conductor to said IC.

3. The heat dissipation structure of the IC as set forth in claim 1, wherein said thermal conductor is attached to the upper surface of said circuit board by said solder.

4. The heat dissipation structure of the IC as set forth in claim 1, wherein said thermal conductor comprises a plurality of lugs extruded from its lower surface so as to be inserted into said through holes.

5. The heat dissipation structure of the IC as set forth in claim 4, wherein said lugs have a diameter less than that of said through holes so as to fill said through holes with said solder.

6. A heat dissipation structure for an Integrated Circuit (IC), comprising:
   a circuit board having a plurality of via holes passing through the circuit board;
   an IC mounted on an upper surface of said circuit board; and
   solder filling a space between the upper surface of the circuit board and a lower surface of the IC and extending through the via holes of the circuit board, wherein rounded protruding portions of the solder extend down below the bottom surface of the circuit board beneath each via hole, the protruding portions being separated from each other.

7. The heat dissipation structure for an IC as set forth in claim 6, wherein the circuit board further comprises a plurality of solder lands adjacent the via holes.

8. The heat dissipation structure for an IC as set forth in claim 7, wherein the solder lands are formed on upper and lower portions of the via holes.

9. The heat dissipation structure for an IC as set forth in claim 7, wherein the solder lands formed on the upper surface of the circuit board extend across an area on the upper surface or the circuit board that approximately matches an area of the lower surface of the IC.

10. The heat dissipation structure for an IC as set forth in claim 6, wherein the via holes have a diameter of approximately 0.5 mm to 1.0 mm.

11. The heat dissipation structure for an IC as set forth in claim 6, wherein the rounded protruding portions of the solder have a larger diameter than a diameter of the via holes.

12. A heat dissipation structure for an Integrated Circuit (IC), comprising:
    a circuit board having a plurality of via holes passing through the circuit board;
    a thermal conductor mounted on an upper surface of the circuit board, the thermal conductor having a plurality of legs extending downward from a lower surface of the thermal conductor, wherein each of the legs extends into a corresponding via hole, wherein solder lands are formed on the circuit board adjacent lower portions of the via holes and wherein an IC is mounted on an upper surface of the thermal conductor; and
    solder surrounding the legs of the thermal conductor and filling the via holes of the circuit board wherein the solder is coupled to the solder lands.

13. The heat dissipation structure for an IC as set forth in claim 12, wherein rounded protruding portions of the solder extend down below a bottom surface of the circuit board beneath each via hole, and wherein the rounded protruding portions are separate from each other.

14. The heat dissipation structure for an IC as set forth in claim 13, wherein the rounded protruding portions of the solder have a larger diameter than a diameter of the via holes.

15. The heat dissipation structure for an IC as set forth in claim 13, wherein solder lands are formed on a lower surface of the circuit board at locations surrounding the via holes.

16. The heat dissipation structure for an IC as set forth in claim 12, wherein solder lands are formed on the circuit board adjacent lower portions of the via holes.

* * * * *